(12) United States Patent
Jeanrenaud

(10) Patent No.: US 12,279,679 B2
(45) Date of Patent: Apr. 22, 2025

(54) METHOD FOR DECORATING A MECHANICAL PART

(71) Applicant: Rubattel & Weyermann S.A., La Chaux-de-Fonds (CH)

(72) Inventor: Frédéric Jeanrenaud, La Chaux-de-Fonds (CH)

(73) Assignee: Rubattel & Weyermann S.A., La-Chaux-de-Fonds (CH)

( * ) Notice: Subject to any disclaimer, the term of this patent is extended or adjusted under 35 U.S.C. 154(b) by 823 days.

(21) Appl. No.: 17/063,953

(22) Filed: Oct. 6, 2020

(65) Prior Publication Data

US 2021/0177111 A1    Jun. 17, 2021

(30) Foreign Application Priority Data

Dec. 16, 2019  (EP) .................... 19216709

(51) Int. Cl.
| | |
|---|---|
| A44C 27/00 | (2006.01) |
| C23C 14/34 | (2006.01) |
| C23C 14/58 | (2006.01) |
| C25D 1/10 | (2006.01) |
| G04B 45/00 | (2006.01) |

(52) U.S. Cl.
CPC ............ A44C 27/006 (2013.01); C23C 14/34 (2013.01); C23C 14/5873 (2013.01); C25D 1/10 (2013.01); G04B 45/0076 (2013.01)

(58) Field of Classification Search
CPC .............................. A44C 27/006; C23C 14/34
See application file for complete search history.

(56) References Cited

U.S. PATENT DOCUMENTS

| | | |
|---|---|---|
| 8,999,217 B2 | 4/2015 | Winkler et al. |
| 10,268,115 B2 | 4/2019 | Calame |

(Continued)

FOREIGN PATENT DOCUMENTS

| | | |
|---|---|---|
| DE | 1191592 B | 4/1965 |
| EP | 2 380 864 A1 | 10/2011 |

(Continued)

OTHER PUBLICATIONS

Translation to EP 3536826 published Sep. 2019.*

(Continued)

*Primary Examiner* — John J Brayton
(74) *Attorney, Agent, or Firm* — Sughrue Mion, PLLC

(57) ABSTRACT

A method for decorating a surface of a mechanical part including: taking the mechanical part to be decorated, on which a decoration element is sought to be produced; depositing on the surface a masking layer having a thickness that is at least equal to the thickness of the decoration element to be produced; making, in the masking layer, at least one cavity that coincides with the location on the surface to be decorated, the cavity having a contour that corresponds to the contour of the decoration element and defining a volume; depositing a bonding layer made of an electrically-conductive material on top of the masking layer and on the surface, in the locations of the cavity, to facilitate the bonding of the decoration element; filling the volume delimited by the masking layer and the surface with a filling material in which the decoration element; and removing the masking layer.

29 Claims, 3 Drawing Sheets

(56) References Cited

U.S. PATENT DOCUMENTS

| | | | |
|---|---|---|---|
| 2011/0103199 A1 | | 5/2011 | Winkler et al. |
| 2011/0236580 A1 | * | 9/2011 | Winkler ............... G04D 3/0048 |
| | | | 427/282 |
| 2019/0278182 A1 | | 9/2019 | Laforge et al. |
| 2019/0302697 A1 | | 10/2019 | Larriere et al. |
| 2021/0060605 A1 | | 3/2021 | Netuschill et al. |

FOREIGN PATENT DOCUMENTS

| | | | |
|---|---|---|---|
| EP | 2796065 A1 | * | 10/2014 |
| EP | 3 246 767 A1 | | 11/2017 |
| EP | 3536826 A1 | * | 9/2019 |
| EP | 3575447 A1 | * | 12/2019 |
| EP | 2 370 865 B1 | | 1/2022 |
| JP | 08283962 | * | 10/1996 |
| JP | 2000-155181 A | | 6/2000 |
| JP | 3642427 A1 | * | 4/2005 |
| JP | 2005-181005 A | | 7/2005 |
| JP | 2008-150660 A | | 7/2008 |
| JP | 2012-502813 A | | 2/2012 |
| JP | 2012-512385 A | | 5/2012 |
| JP | 2016-133876 A | | 8/2016 |
| JP | 2019-157268 A | | 9/2019 |
| JP | 2021-32877 A | | 3/2021 |
| TW | 202108272 A | | 3/2021 |
| WO | 2010/060959 A1 | | 6/2010 |

OTHER PUBLICATIONS

Translation to EP 3575447 published Dec. 2019.*
Translation to JP 08-283962 published Oct. 1996.*
European Search Report of EP 19 21 6709 dated Aug. 7, 2019.

* cited by examiner

METHOD FOR DECORATING A MECHANICAL PART

CROSS REFERENCE TO RELATED APPLICATION

This application claims priority to European Patent Application No. 19216709.6 filed Dec. 16, 2019, the entire contents of which are incorporated herein by reference.

TECHNICAL FIELD OF THE INVENTION

The present invention relates to a method for decorating a mechanical part. More specifically, the invention relates to a method for decorating at least one surface to be decorated of a mechanical part used in the horological or jewellery field.

BACKGROUND OF THE INVENTION

Numerous methods for producing raised decorations on a surface of a mechanical part such as a watch dial or a bezel are known in the prior art. A certain number of these known methods consist of manufacturing the decoration elements separately from the mechanical part to be decorated, then of fastening these decoration elements to the mechanical part for which they are intended.

Another method for decorating a mechanical part such as a dial is known from the European patent application EP 2 370 865 A1 filed by The Swatch Group Research and Development Ltd. This decoration method consists of:
  taking the mechanical part to be decorated;
  making a mask of the plate type, the thickness thereof being at least equal to the desired thickness of the decoration elements, and in which openings are machined, the contours thereof corresponding to the shape of the desired decoration elements;
  positioning the mask on the surface to be decorated of the mechanical part such that the openings of the mask coincide with the locations of the mechanical part intended to receive the decoration elements;
  the mask whose thickness corresponds at least to the desired thickness of the decoration elements forms, with the mechanical part to be decorated, moulds which will be filled with a filling material; and
  removing the mask to reveal the decoration elements on the surface of the decorated mechanical part.

One advantage of this decoration method resides in the relative simplicity of implementation thereof. More specifically, whereas in the case of numerous decoration methods, the decoration elements are produced separately from the mechanical part to be decorated, then merely fastened to this mechanical part, in the case in which a mask is used, the decoration elements are directly produced and fastened to the mechanical part to be decorated in the same step of the method, which saves time.

One drawback of the decoration method using masks placed on the surface of the mechanical part to be decorated can nonetheless be seen in the fact that the risk of the mask not being in close contact with the surface of the mechanical part to be decorated cannot be ruled out, and that when filling the different moulds, there is a risk of the filling material leaking a little on the surface of the mechanical part, which requires some of these mechanical parts to be discarded. This is in particular problematic when looking to decorate dials for timepieces, since such dials are expensive mechanical parts.

SUMMARY OF THE INVENTION

The purpose of the present invention is to overcome the aforementioned problems as well as others by proposing a method for decorating mechanical parts such as a watch dial or bezel which in particular prevents the decoration elements fixed to the surface of the mechanical part to be decorated from having smears that must be eliminated, or which even lead to the discarding of some of these mechanical parts. The present invention further relates to procuring a method for decorating mechanical parts thanks to which the decoration elements are firmly anchored to the surface of the decorated mechanical part.

For this purpose, the present invention relates to a method for decorating at least one surface to be decorated of a mechanical part comprising the following steps of:
  taking the mechanical part to be decorated, on which at least one decoration element is sought to be produced according to a predetermined thickness and contour;
  depositing, on the at least one surface to be decorated of the mechanical part, a masking layer having a thickness that is at least equal to the thickness of the at least one decoration element to be produced;
  making, in the masking layer, at least one first cavity that coincides with the location on the at least one surface to be decorated of the mechanical part where the at least one decoration element is to be produced, the at least one first cavity having a contour that corresponds to the contour of the at least one decoration element to be produced and defining a volume with the at least one surface to be decorated of the mechanical part;
  filling the volume delimited by the at least one first cavity with a filling material in which the at least one decoration element is intended to be produced;
  removing the masking layer.

Thanks to these features, the present invention provides a method for decorating a mechanical part such as a dial or a bezel of a timepiece wherein the masking layer is directly formed on the surface of the mechanical part to be decorated. The masking layer is thus guaranteed to be in close contact with the surface of the mechanical part to be decorated, preventing any risk of the filling material in which the decoration elements are to be produced from running between the masking layer and the surface of the mechanical part to be decorated, which allows defined high-precision decoration elements to be obtained. In particular, the shape and the thickness of the decoration elements are meticulously adjusted. Moreover, the formation of a sacrificial mask directly on the surface of the object to be structured is simpler, faster and less costly than machining a mask separately from the mechanical part to be decorated, then positioning and pressing this mask on the surface to be decorated of the mechanical part. It is also understood that, in the specific case whereby the material used for the masking layer and that used to produce the decoration elements have similar hardnesses, the finishing operations such as sanding, brushing, glossing, polishing or other operations are vastly simplified.

According to specific embodiments, the method for decorating a mechanical part according to the invention is characterised in that it comprises the following steps:
  making, following the at least one first cavity, at least one second cavity in the at least one surface to be decorated of the mechanical part;

depositing a first bonding layer on the at least one surface to be decorated of the mechanical part, before depositing the masking layer, in order to facilitate the bonding of the masking layer;

depositing a second bonding layer on top of the masking layer and on the at least one surface to be decorated, in the locations where the first and optionally the second cavities have been made, to facilitate the bonding of the at least one decoration element;

filling the volume delimited by the masking layer and the at least one surface to be decorated of the mechanical part by means of a filling material in which the at least one decoration element is sought to be produced, this filling material preferentially being deposited by galvanic growth;

the first bonding layer of the masking layer and the second bonding layer of the decoration elements are deposited by vacuum evaporation or by cathodic sputtering;

the first bonding layer of the masking layer and the second bonding layer of the at least one decoration element are made of an electrically-conductive material;

the first bonding layer of the masking layer and the second bonding layer of the at least one decoration element are formed by a layer of chromium (Cr) on top of which a layer of gold (Au) is deposited;

the layer of chromium and the layer of gold each have a thickness that is substantially equal to 50 nm;

the masking layer is metallic;

the masking layer is made of silver (Ag), copper (Cu), or nickel (Ni), the thickness of the masking layer is at least equal to 20 µm and, preferably, lies in the range 20 µm to 400 µm (inclusive);

the masking layer is deposited on the at least one surface to be decorated of the mechanical part by electroforming;

the filling material is a crystalline metal or an amorphous metal;

the crystalline metal is gold or nickel;

the amorphous metal is an amorphous platinum alloy, or an amorphous palladium alloy, or an amorphous zirconium alloy;

etching, through the at least one first cavity made in the masking layer and the bonding layer of the at least one decoration element, at least one second cavity in the at least one surface to be decorated of the mechanical part;

the at least one first cavity in the masking and bonding layers and the at least one second cavity in the at least one surface to be decorated are etched simultaneously using a laser beam;

the depth of the at least one second cavity etched in the surface to be decorated of the mechanical part does not exceed 20 µm;

the at least one second cavity etched in the at least one surface to be decorated of the mechanical part comprises means for anchoring the filling material;

the at least one second cavity is delimited by at least one wall which, relative to a vertical plane perpendicular to the at least one surface to be decorated of the mechanical part, progressively deviates from this vertical plane as it moves away from said at least one surface to be decorated of the mechanical part;

drilling at least one conical hole in a bottom of the at least one second cavity, this conical hole flaring out towards a rear surface opposite the at least one surface to be decorated of the mechanical part;

before depositing the masking layer, the first bonding layer, which is intended to facilitate the bonding of the masking layer to obtain a planar surface parallel to the surface to be decorated of the mechanical part, is levelled;

after filling the volume delimited by the masking layer and the at least one surface to be decorated of the mechanical part and, optionally, of the underlying cavity using the filling material, machining and finishing the at least one surface to be decorated, the masking layer and the filling material;

after machining and finishing, the residual thickness of the masking layer and of the filling material is equal to about 200 µm;

after machining and finishing, the masking layer is removed;

the masking layer is removed by etching in a chemical bath;

the filling material is glossed or polished.

It can be seen that the deposition of a second bonding layer on the surface to be decorated of the mechanical part, in the locations where the first cavities are made, allows the adherence of the decoration elements on the surface of the part to be decorated to be significantly improved, through which optional operations for truing the top surface of the decoration elements after the deposition thereof is made easier. Moreover, this guarantees a very good resistance of the decoration elements over time. Preferentially, this bonding layer is made of an electrically-conductive material and can thus be deposited on top of the masking layer.

Similarly, it can be seen that the strength of adhesion of the decoration elements is further improved when second cavities, following the first cavities, are machined in the thickness of the mechanical part to be decorated in the locations that are to receive the decoration elements. More specifically, thanks to the presence of the second cavities, the decoration elements are anchored deep within the mechanical part to be decorated and the risks of same becoming detached from this mechanical part are very low.

BRIEF DESCRIPTION OF THE FIGURES

Other features and advantages of the present invention will appear more clearly upon reading the following detailed description of one example embodiment of the method according to the invention, said example being provided for illustrative purposes only and not intended to limit the scope of the invention, with reference to the accompanying drawing, wherein.

DETAILED DESCRIPTION OF ONE EMBODIMENT OF THE INVENTION

Figure 1:
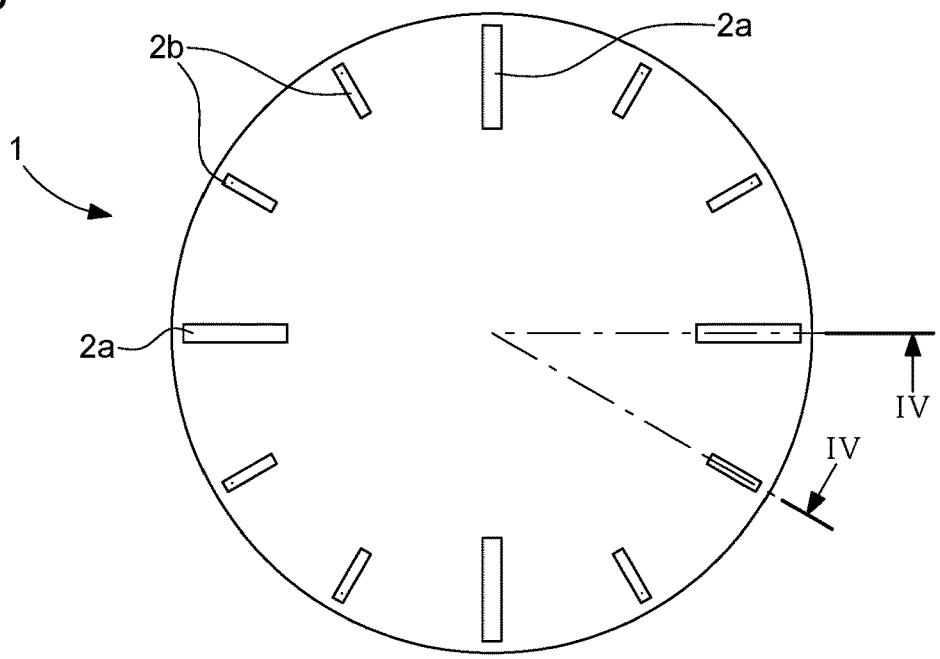
FIG. 1 is an overhead view of a watch dial decorated in accordance with the method of the invention.

The present invention proceeds from the general inventive idea consisting of forming decoration elements on a surface of a mechanical part to be decorated, in particular watch dials and more generally external elements of timepieces such as bezels, middles or even bracelet links, in addition to jewellery. In order to achieve this result, the present invention discloses the deposition, directly on the surface to be decorated of the mechanical part, of a mask of the sacrificial type, that is to say a mask that is intended to be removed at the end of the operations for decorating the mechanical part. Once the mask has been deposited in close contact with the surface of the mechanical part to be decorated, then structured so as to create first cavities therein which will be filled with the material in which the decoration elements are to be produced, the surface formed by the top of the mask and the decoration elements undergoes machining and potentially dressing, after which the mask is removed, conventionally by etching in a chemical bath. In order to further improve the resistance of the decoration elements on the surface of the mechanical part to be decorated, the present invention proposes depositing, after the deposition of the masking layer, a second bonding layer on the surface to be decorated, in the locations where the first cavities have been made, in order to facilitate the bonding of the decoration elements. Through the wise choice of the material used to produce the second bonding layer, very good adhesion of the decoration elements on the surface of the mechanical part to be decorated is guaranteed. This facilitates subsequent truing and finishing operations concerning the decoration elements as well as the mechanical resistance thereof over time.

In accordance with the invention, a mechanical part to be decorated is firstly taken. In the example shown in the drawing, this mechanical part to be decorated is a watch dial 1. It goes without saying that this example is provided for illustrative purposes only and in no way limits the scope of the invention, where the mechanical part to be decorated is capable of being of any type, such as an external element for a timepiece (bezel, bracelet link, middle, etc.), a bridge, a plate, an oscillating weight or even a jewellery item. The only restriction to which this mechanical part sought to be decorated is subject is that it must be made of a material having mechanical properties that are not modified in the temperature range implemented by the method of the invention. In other words, the mechanical part must not be deformed, softened or melted during the decoration operations according to the invention.

As per the invention, the watch dial 1 is intended to be fitted with at least one decoration element, the dimensions and the thickness thereof depending on the needs. By way of example, in the case where the mechanical part to be decorated is a watch dial 1, the decoration elements can be used to form the hour symbols: as shown in FIG. 1, four first decoration elements 2a of a first dimension can, for example, be used to denote midday, three o'clock, six o'clock and nine o'clock on the watch dial 1, whereas eight second decoration elements 2b of a second dimension can be used to denote the other full hours and complete the hour revolution.

Figure 2:
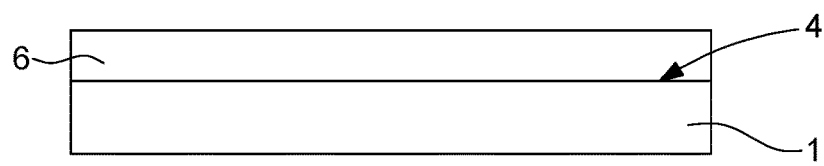
FIG. 2 is an elevation view of a watch dial on a surface to be decorated of which a masking layer has been deposited.

Once equipped with the watch dial 1, a masking layer 6 intended to form a mask of the sacrificial type is deposited on a surface to be decorated 4 of this watch dial 1, typically the top surface of this watch dial 1 (see FIG. 2). The term "sacrificial" is understood herein to refer to a masking layer which is removed after having fulfilled its purpose. This masking layer 6 will have a thickness that depends on the desired height by which the decoration elements 2a, 2b will ultimately project above the surface to be decorated 4 of the watch dial 1 once the machining operations have been carried out. For the purposes of illustration only, the thickness of the masking layer 6 is 400 µm. The thickness of the masking layer 6 must be at least equal to the desired height by which the decoration elements 2a, 2b will project above the surface to be decorated 4 once the machining operations have been carried out.

By way of a preferred example only, the masking layer 6 can be formed by a polymer layer or a metal layer. In the case where the masking layer 6 is metallic, it can in particular be made of silver, copper or even nickel and is deposited on the watch dial 1 by any suitable technique such as electroforming.

Figure 3:
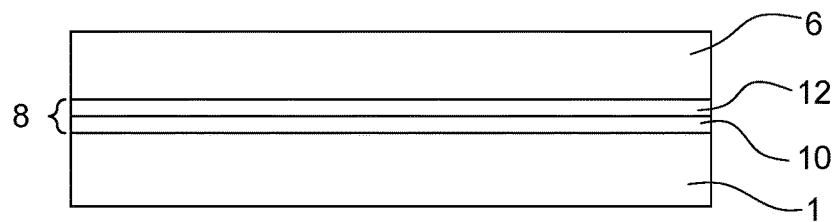
FIG. 3 is an elevation view of the watch dial in FIG. 2 with the insertion of a first bonding layer between the surface to be decorated of the watch dial and the masking layer.

It should be noted that, according to one preferred embodiment of the invention, before depositing the masking layer 6, a first bonding layer 8 is deposited on the surface to be decorated 4 of the watch dial 1 in order to optimise the adhesion of the masking layer 6 (see FIG. 3). Preferentially, this first bonding layer 8 is electrically-conductive and is formed, for example, by a sub-layer of chromium 10 whereon a sub-layer of gold 12 is deposited. A series of tests has determined that a thickness of about 50 nm for each of the sub-layers of chromium 10 and gold 12 provided excellent results as regards the strength of adhesion of the masking layer 6 on the watch dial 1. The first bonding layer 8 is preferentially deposited by vacuum evaporation or by cathodic sputtering. The deposition of the first bonding layer 8 is in particular necessary in the case whereby the watch dial 1 is made of a non-electrically-conductive material such as ceramic, stone or enamel. It goes without saying that the watch dial 1 can also be made of an electrically-conductive metallic material. In such a case, the bonding layer 8 can be omitted insofar as the masking layer 6 can be deposited, for example by electroforming, directly on the surface to be decorated 4 of the watch dial 1.

Figure 4:
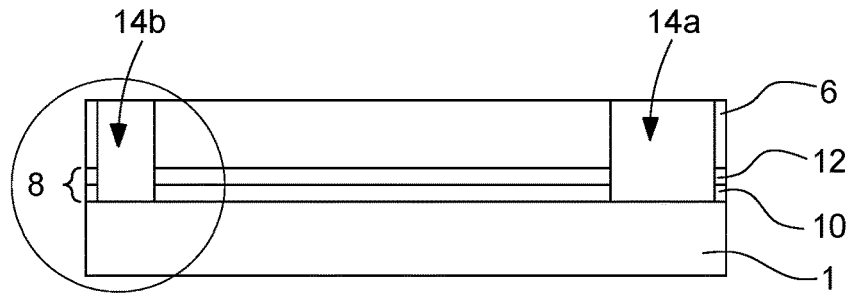
FIG. 4 is an elevation and section view of the watch dial according to line IV-IV in FIG. 1, wherein first cavities have been made in the masking layer and the bonding layer at the locations at which the decoration elements are to be produced.

Once the first bonding layer 8 and the masking layer 6 have been deposited after one another on the surface to be decorated 4 of the watch dial 1, at least one first cavity is made in the masking layer 6 and the bonding layer 8, at the location that coincides with the position on the surface to be decorated 4 of the watch dial 1 in which the decoration element is to be produced (see FIG. 4), and the contour and the height thereof corresponding to the shape and to the dimensions of the desired decoration elements. In the case described here, there are twelve such first cavities, four cavities 14a corresponding to the first four decoration elements 2a used to denote midday, three o'clock, six o'clock and nine o'clock on the watch dial 1, and eight cavities 14b corresponding to the decoration elements 2b used to denote the other full hours and complete the hour revolution on the watch dial 1. The twelve cavities 14a, 14b can be considered to have the same shape, for example square or rectangular, but the dimensions of the four cavities 14a can be considered to be larger than those of the eight cavities 14b. These twelve cavities 14a, 14b are cut into the masking layer 6 and the first bonding layer 8 by any suitable means such as a laser beam.

Figure 5:
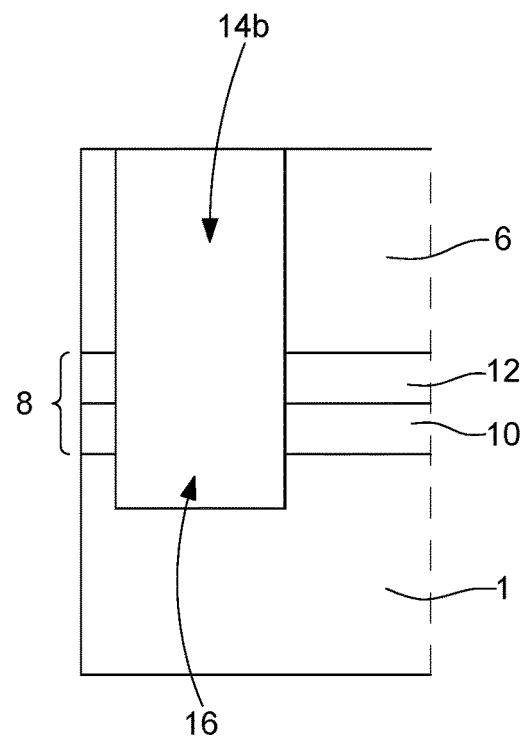
FIG. 5 is a view at a larger scale of the encircled region in FIG. 4, wherein a second cavity has been etched in the thickness of the surface to be decorated of the watch dial to improve the anchoring of the decoration elements.

According to one preferred but non-limiting embodiment of the invention, second cavities 16 are etched in the surface to be decorated 4 of the watch dial 1, through the first cavities 14a, 14b made in the masking layer 6 and the bonding layer 8 (see FIG. 5). These second cavities 16, which are preferably machined at the same time as the first cavities 14a, 14b, are intended to improve the immobilisation of the decoration elements 2a, 2b on the surface to be decorated 4 of the watch dial 1. For the purposes of illustration only, the depth of these second cavities 16 does not exceed 20 µm.

Figure 6:
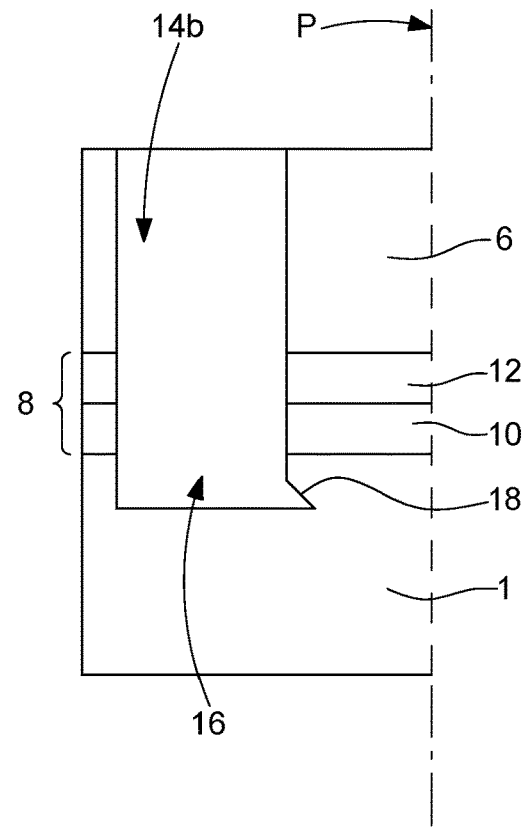
FIG. 6 is a similar view to that of FIG. 5, wherein the second cavity has an inclined inner wall to improve the anchoring of the decoration elements.

In order to further improve the immobilisation of the decoration elements 2a, 2b, the second cavities 16 are provided with anchoring means. According to a first embodiment of the invention (see FIG. 6), these anchoring means are formed by at least one face 18 of the wall 20 of the second cavity 16 which, relative to a vertical plane P perpendicular to the surface to be decorated 4 of the watch dial 1, progressively deviates from this vertical plane P as it moves away from said surface to be decorated 4 of the watch dial 1. Thanks to the presence of this inclined face 18, it is understood that once the second cavities 16 have been filled with the filling material, the resulting decoration elements 2a, 2b can no longer be dislodged from the second cavities 16 and are thus permanently anchored to the watch dial 1.

Figure 7:
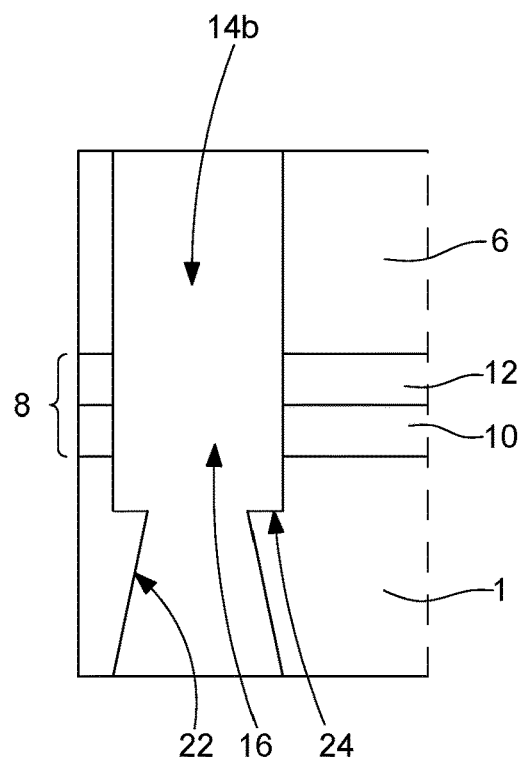
FIG. 7 is a similar view to that of FIG. 5, wherein a conical hole drilled in the watch dial and opening out into the bottom of the cavity is intended to improve the anchoring of the decoration element.

Another embodiment of the invention which also aims to improve the anchoring of the decoration elements 2a, 2b on the surface to be decorated 4 of the watch dial 1 provides for drilling at least one conical hole 22 in the bottom 24 of the second cavities 16, these conical holes 22 flaring out towards the rear surface 26 of the watch dial 1, opposite the surface to be decorated 4 (see FIG. 7). It is also understood in this case that once the second cavities 16 and the conical holes 22 have been filled with the filling material, the decoration elements 2a, 2b can no longer be dislodged.

Figure 8:
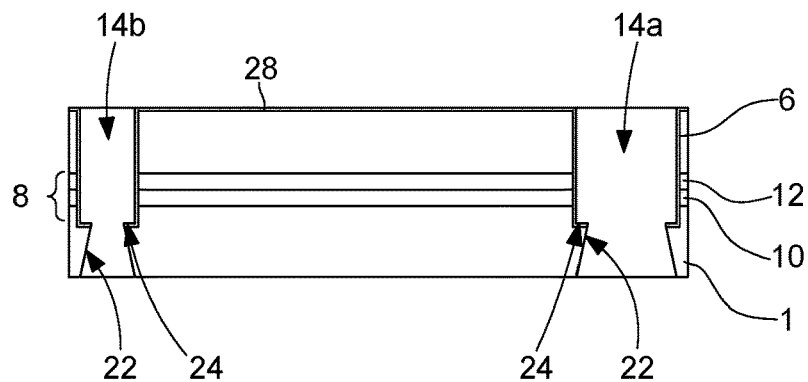
FIG. 8 is an elevation view of the watch dial on the surface to be decorated of which a second decoration element bonding layer has been deposited on top of the masking layer.

Once the first cavities 14a, 14b have been machined, and the second cavities 16 potentially etched, a second bonding layer 28 made of an electrically-conductive material is deposited on the surface to be decorated 4, in the locations where the first cavities 14a, 14b are made to facilitate the bonding of the decoration elements 2a, 2b (see FIG. 8). It goes without saying that, in order to more easily implement the method, the second bonding layer 28 can also be deposited on top of the masking layer 6. This second bonding layer 28 for bonding the decoration elements 2a, 2b is made of an electrically-conductive material deposited by vacuum evaporation or by cathodic sputtering. By way of a non-limiting example only, the second bonding layer 28 is composed of a gold sub-layer (Au) on top of which a chromium sub-layer (Cr) is deposited, each of these two gold and chromium sub-layers having a thickness in the order of 50 nm. The second bonding layer 28, by facilitating the bonding of the filling material from which the decoration elements 2a, 2b will be made, will facilitate the bonding of these decoration elements 2a, 2b on the surface to be decorated 4 and guarantee the high mechanical resistance thereof over time.

Figure 9:
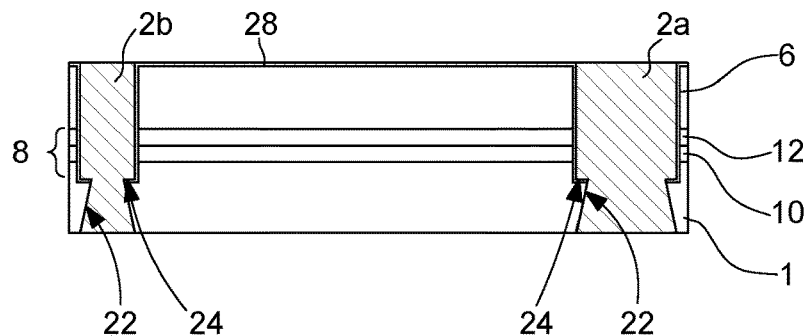
FIG. 9 is an elevation view of the watch dial on which the first cavities and the second cavities are shown to have been filled with a filling material.

Once the second bonding layer 28 has been deposited, the first cavities 14a, 14b and the second cavities 16 where relevant, are thus filled with a filling material (FIG. 9). Depending on the case, the filling material can be a crystalline metal or an amorphous metal. In the case of a filling material of the amorphous metal type, an amorphous platinum alloy, or an amorphous palladium alloy, or an amorphous zirconium alloy is preferably used.

It should be noted that, before filling the volume delimited by the masking layer 6 and the surface to be decorated 4 of the watch dial 1, the masking layer 6 can be levelled to obtain a planar surface parallel to the surface to be decorated 4 of the watch dial 1.

Figure 10:
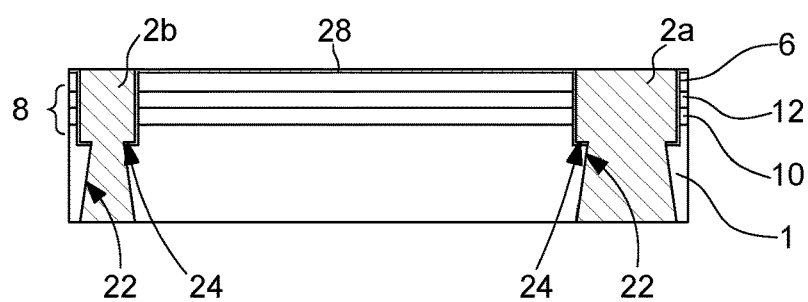
FIG. 10 is an elevation view of the watch dial on which the thickness of the masking layer and of the decoration elements is seen to have been reduced by half during finishing operations carried out on the top surface of the decoration elements.

As already mentioned above, the thickness of the masking layer 6 can be determined to be 400 µm for example. At this stage of the invention, the thickness of the decoration elements 2a, 2b is thus equal to about 400 µm. If the thickness of the decoration elements 2a, 2b is ultimately desired to be 200 µm above the surface to be decorated 4, this means that excess filling material about 200 µm thick is provided in order to true the decoration elements 2a, 2b and perfect the surface finish thereof, in particular by glossing or polishing same (see FIG. 10).

Figure 11:
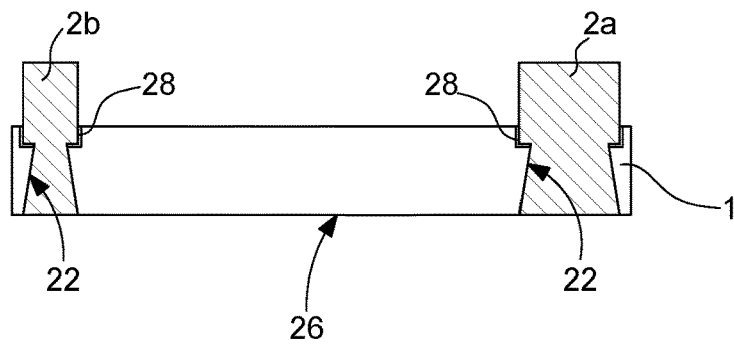
FIG. 11 is an elevation view of the watch dial in which the masking layer and the bonding layers have been removed.

Once the finishing operations for the decoration elements 2a, 2b are complete, the masking layer 6 is removed, typically by etching in a chemical bath, and the decoration elements 2a, 2b are revealed in full (see FIG. 11).

It goes without saying that this invention is not limited to the embodiments described above, and that various simple alternatives and modifications can be considered by a person skilled in the art without leaving the scope of the invention as defined by the accompanying claims.

NOMENCLATURE

1. Watch dial
2a, 2b. Decoration elements
4. Surface to be decorated
6. Masking layer
8. First bonding layer
10. Layer of chromium
12. Layer of gold
14a, 14b. First cavities
16. Second cavities
18. Face
20. Wall
22. Conical hole
24. Bottom
26. Rear surface
28. Second bonding layer

The invention claimed is:

1. A method for decorating at least one surface to be decorated (4) of a mechanical part, the method comprising and being implemented in order of the following steps of:
   taking the mechanical part to be decorated, on which at least one decoration element (2a, 2b) is sought to be produced according to a predetermined thickness and contour;
   depositing, on the at least one surface to be decorated (4) of the mechanical part, a masking layer (6) having a thickness that is at least equal to the thickness of the at least one decoration element (2a, 2b) to be produced;

making, in the masking layer (6), at least one first cavity (14a, 14b) that coincides with the location on the at least one surface to be decorated (4) of the mechanical part where the at least one decoration element (2a, 2b) is to be produced, the at least one first cavity (14a, 14b) having a contour that corresponds to the contour of the at least one decoration element (2a, 2b) to be produced and defining a volume with the at least one surface to be decorated (4) of the mechanical part;

following making the at least one first cavity (14a, 14b), making, through the at least one first cavity (14a, 14b) and into the at least one surface to be decorated (4), at least one second cavity (16) in the at least one surface to be decorated (4) of the mechanical part;

filling the volume delimited by the at least one first cavity (14a, 14b) with a filling material in which the at least one decoration element (2a, 2b) is intended to be produced; and removing the masking layer (6), wherein the at least one second cavity (16) comprise a portion which is inclined relative to the at least one first cavity (14a, 14b), wherein at least one conical hole (22) is drilled in a bottom (24) of the at least one second cavity (16), this at least one conical hole (22) flaring out towards a rear surface (26) of the mechanical part, opposite the at least one surface to be decorated (4).

2. The decorating method according to claim 1, wherein, before depositing the masking layer (6), a first bonding layer (8) is deposited on the at least one surface to be decorated (4) of the mechanical part, to facilitate the bonding of the masking layer (6).

3. The decorating method according to claim 1, wherein, after depositing the masking layer (6) and before depositing the filling material, a second bonding layer (28) is deposited on the at least one surface to be decorated (4), in the locations where the at least one first and potentially the at least one second cavity (16) are made, to facilitate the bonding of the at least one decoration element (2a, 2b).

4. The decorating method according to claim 2, wherein, after depositing the masking layer (6) and before depositing the filling material, a second bonding layer (28) is deposited on the at least one surface to be decorated (4), in the locations where the at least one first and potentially the at least one second cavity (16) are made, to facilitate the bonding of the at least one decoration element (2a, 2b).

5. The decorating method according to claim 3, wherein a first bonding layer (8) of the masking layer (6) and the second bonding layer (28) of the at least one decoration element (2a, 2b) are deposited by vacuum evaporation or by cathodic sputtering.

6. The decorating method according to claim 4, wherein the first bonding layer (8) of the masking layer (6) and the second bonding layer (28) of the at least one decoration element (2a, 2b) are deposited by vacuum evaporation or by cathodic sputtering.

7. The decorating method according to claim 5, wherein the first bonding layer (8) of the masking layer (6) and the second bonding layer (28) of the at least one decoration element (2a, 2b) are made of an electrically-conductive material.

8. The decorating method according to claim 6, wherein the first bonding layer (8) of the masking layer (6) and the second bonding layer (28) of the at least one decoration element (2a, 2b) are made of an electrically-conductive material.

9. The decorating method according to claim 7, wherein the first bonding layer (8) of the masking layer (6) and the second bonding layer (28) of the at least one decoration element (2a, 2b) are formed by a layer of chromium (10) on top of which a layer of gold (12) is deposited.

10. The decorating method according to claim 9, wherein the layer of chromium (10) and the layer of gold (12) each have a thickness that is substantially equal to 50 nm.

11. The decorating method according to claim 7, wherein the masking layer (6) is metallic.

12. The decorating method according to claim 11, wherein the masking layer (6) is made of silver, copper or nickel.

13. The decorating method according to claim 12, wherein the thickness of the masking layer (6) is at least equal to 20 μm.

14. The decorating method according to claim 11, wherein the masking layer (6) is deposited on the at least one surface to be decorated (4) of the mechanical part by electroforming.

15. The decorating method according to claim 1, wherein the filling material is a crystalline metal or an amorphous metal.

16. The decorating method according to claim 15, wherein the crystalline metal is gold or nickel.

17. The decorating method according to claim 15, wherein the amorphous metal is an amorphous platinum alloy, an amorphous palladium alloy, or an amorphous zirconium alloy.

18. The decorating method according to claim 1, wherein the at least one first cavity (14a, 14b) and the at least one second cavity (16) are simultaneously etched using a laser beam.

19. The decorating method according to claim 18, wherein the depth of the at least one second cavity (16) etched in the at least one surface to be decorated (4) of the mechanical part does not exceed 20 μm.

20. The decorating method according to claim 1, wherein the at least one second cavity (16) etched in the at least one surface to be decorated (4) of the mechanical part comprises means for anchoring the at least one decoration element (2a, 2b).

21. The decorating method according to claim 20, wherein the at least one second cavity (16) is delimited by a wall (20), at least one face (18) thereof progressively deviating from a plane (P) perpendicular to the at least one surface to be decorated (4) of the mechanical part as this face (18) moves away from said at least one surface to be decorated (4) of the mechanical part.

22. The decorating method according to claim 2, wherein before depositing the masking layer (6), the first bonding layer (8) is levelled, which layer is intended to facilitate the bonding of the masking layer (6) to obtain a planar surface parallel to the surface to be decorated (4) of the mechanical part (1).

23. The decorating method according to claim 1, wherein after filling the volume delimited by the at least one first cavity (14a, 14b) made in the masking layer (6) with the filling material and before removing the masking layer (6), the top surface of the at least one decoration element (2a, 2b) is machined and finished.

24. The decorating method according to claim 23, wherein the at least one decoration element (2a, 2b) and the masking layer (6) are subjected to at least one of the following finishing operations: sanding, brushing, glossing or polishing.

25. The decorating method according to claim 23, wherein after machining and finishing, the residual thickness of the at least one masking layer (6) and of the decoration elements (2a, 2b) is equal to about 200 μm.

26. The decorating method according to claim 23, wherein after machining and finishing the at least one decoration element (2a, 2b), the masking layer (6) is removed.

27. The decorating method according to claim 26, wherein the masking layer (6) is removed by etching in a chemical bath.

28. A method for decorating at least one surface to be decorated (4) of a mechanical part, the method comprising and being implemented in order of the following steps of:
- taking the mechanical part to be decorated, on which at least one decoration element (2a, 2b) is sought to be produced according to a predetermined thickness and contour;
- depositing, on the at least one surface to be decorated (4) of the mechanical part, a masking layer (6) having a thickness that is at least equal to the thickness of the at least one decoration element (2a, 2b) to be produced;
- making, in the masking layer (6), at least one first cavity (14a, 14b) that coincides with the location on the at least one surface to be decorated (4) of the mechanical part where the at least one decoration element (2a, 2b) is to be produced, the at least one first cavity (14a, 14b) having a contour that corresponds to the contour of the at least one decoration element (2a, 2b) to be produced and defining a volume with the at least one surface to be decorated (4) of the mechanical part;
- following making the at least one first cavity (14a, 14b), making, through the at least one first cavity (14a, 14b) and into the at least one surface to be decorated (4), at least one second cavity (16) in the at least one surface to be decorated (4) of the mechanical part;
- filling the volume delimited by the at least one first cavity (14a, 14b) with a filling material in which the at least one decoration element (2a, 2b) is intended to be produced; and
- removing the masking layer (6),
- wherein the at least one second cavity (16) comprise a portion which is inclined relative to the at least one first cavity (14a, 14b),
- wherein the at least one second cavity (16) etched in the at least one surface to be decorated (4) of the mechanical part comprises means for anchoring the at least one decoration element (2a, 2b), and
- wherein at least one conical hole (22) is drilled in a bottom (24) of the at least one second cavity (16), this at least one conical hole (22) flaring out towards a rear surface (26) of the mechanical part, opposite the at least one surface to be decorated (4).

29. A method for decorating at least one surface to be decorated (4) of a mechanical part comprising the following steps of:
- taking the mechanical part to be decorated, on which at least one decoration element (2a, 2b) is sought to be produced according to a predetermined thickness and contour;
- depositing, on the at least one surface to be decorated (4) of the mechanical part, a masking layer (6) having a thickness that is equal to or greater than the thickness of the at least one decoration element (2a, 2b) to be produced;
- making, in the masking layer (6), at least one first cavity (14a, 14b) that coincides with the location on the at least one surface to be decorated (4) of the mechanical part where the at least one decoration element (2a, 2b) is to be produced, the at least one first cavity (14a, 14b) having a contour that corresponds to the contour of the at least one decoration element (2a, 2b) to be produced and defining a volume with the at least one surface to be decorated (4) of the mechanical part;
- filling the volume delimited by the at least one first cavity (14a, 14b) with a filling material in which the at least one decoration element (2a, 2b) is intended to be produced; and
- removing the masking layer (6),
- wherein, before depositing the masking layer (6), a first bonding layer (8) is deposited on the at least one surface to be decorated (4) of the mechanical part, to facilitate the bonding of the masking layer (6), and
- wherein, after depositing the masking layer (6) and before depositing the filling material, a second bonding layer (28) is deposited on the at least one surface to be decorated (4), in the locations where the at least one first and potentially at least one second cavity (14a, 14b; 16) are made, to facilitate the bonding of the at least one decoration element (2a, 2b).

* * * * *